United States Patent
Kolberg et al.

(10) Patent No.: US 6,899,954 B2
(45) Date of Patent: May 31, 2005

(54) CADMIUM-FREE OPTICAL STEEP EDGE FILTERS

(75) Inventors: Uwe Kolberg, Mainz (DE); Helge Vogt, Bodenheim (DE); Simone Ritter, Mainz (DE); Burkhard Speit, Mainz (DE); Hans-Werner Schock, Stuttgart (DE); Christine Köble, Berlin (DE); Raymund Schäffler, Leinfelden-Echterdingen (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/224,153

(22) Filed: Aug. 20, 2002

(65) Prior Publication Data

US 2003/0123167 A1 Jul. 3, 2003

(30) Foreign Application Priority Data

Aug. 22, 2001 (DE) ......................................... 101 41 102

(51) Int. Cl.[7] ................................................. B32B 9/00
(52) U.S. Cl. ....................... 428/433; 428/615; 428/673; 428/674; 428/432; 428/434; 428/697; 428/699; 427/255.15; 359/589; 359/361; 359/601; 204/192.1
(58) Field of Search ................................. 428/615, 618, 428/621, 632, 642, 650, 655, 660, 663, 668, 673, 674, 457, 469, 472, 426, 432, 433, 434, 697, 699, 701, 702, 689; 359/601, 361, 589, 586, 588; 427/164, 248.1, 250, 255.11, 255.15, 419.2, 419.3; 204/192.1

(56) References Cited

U.S. PATENT DOCUMENTS 3,806,349 A   4/1974  Matsuura ..................... 106/54
4,106,946 A   8/1978  Ritze ........................... 106/52

(Continued)

FOREIGN PATENT DOCUMENTS

| | | |
|---|---|---|
| DE | 20 26 485 | 12/1970 |
| DE | 26 21 741 | 6/1979 |
| DE | 34 36 016 | 4/1986 |
| DE | 38 32 111 | 4/1989 |
| DE | 37 42 204 | 6/1989 |
| DE | 38 30 089 | 3/1990 |
| DE | 198 55 021 | 5/2000 |
| EP | 0 410 160 | 1/1991 |
| JP | 03-277928 | 12/1991 |
| JP | 05-234894 | 9/1993 |
| JP | 07-122762 | 5/1995 |
| JP | 11-284209 | 10/1999 |
| WO | WO 00/31323 | 6/2000 |

OTHER PUBLICATIONS

Minsk Radio Eng. Inst., "Optical Glass Composition Used in Laser Technology", Sep. 15, 1991.

G. Aren et al., "Chalcopyrite Culn (Se, S)2 Semiconducting Thin Films", Journal of Materials Science Letters, pp. 1176–1177, 1993.

"Shott Guide to Glass" edited by Chapman and Hall, pp. 23–26 and 27–30, no date.

H.G. Pfaender : Schott Glaslexikon pp. 28, 28 and pp. 33, 1997, no month.

Primary Examiner—Deborah Jones
Assistant Examiner—G. Blackwell-Rudasill
(74) Attorney, Agent, or Firm—Baker & Daniels

(57) ABSTRACT

A cadmium-free optical steep edge filter comprising I-III-VI compound semiconductor systems of stoichiometric or non-stoichiometric composition, where the I-III-VI compound semiconductors are systems with one or more of the following elements:

for the univalent (I) elements: Cu, Ag
for the tervalent (III) elements: Al, In, Ga
for the hexavalent (VI) elements: S, Se, Te.

34 Claims, 1 Drawing Sheet

U.S. PATENT DOCUMENTS

| | | | |
|---|---|---|---|
| 4,228,349 A | 10/1980 | Ettenberg et al. | 250/226 |
| 4,868,004 A | 9/1989 | Zultzke et al. | 427/42 |
| 4,975,328 A | 12/1990 | Hirose et al. | 428/413 |
| 5,125,984 A | 6/1992 | Kruehler et al. | 136/255 |
| 5,633,033 A * | 5/1997 | Nishitani et al. | 427/8 |
| 5,674,555 A * | 10/1997 | Birkmire et al. | 427/76 |
| 5,945,163 A | 8/1999 | Powell et al. | 427/255.1 |
| 6,323,417 B1 * | 11/2001 | Gillespie et al. | 136/262 |

\* cited by examiner

CADMIUM-FREE OPTICAL STEEP EDGE FILTERS

BACKGROUND OF THE INVENTION

The invention relates to cadmium-free optical steep edge filters and a method for producing same.

Optical steep edge filters are characterized by their typical transmission properties. In the short-wave range, the transmission is low. It increases to high transmission over a narrow spectral range and remains high in the long-wave range. The range of low transmission is called stop band, the range of high transmission is called pass band.

Optical steep edge filters are characterized by the following parameters:

The edge wavelength $\lambda_c$ is the wavelength at which the spectral internal transmittance between stop band and pass band amounts to half of the maximum value.

Stop band: In the stop band, the internal transmittance factor $\tau_{is}$ does not exceed $10^{-5}$. The stop band usually begins between approx. 40 and 60 nm below $\lambda_c$.

Pass band: In the pass band, the internal transmittance factor $\tau_{ip}$ does not fall below 0.99. The pass band begins between approx. 40 and 60 nm above $\lambda_c$.

A typical example of a state of the art steep edge filter is Schott Glas OG 590, where $\lambda_c$ is 590 nm. The stop band is reached below 540 nm ($\tau_{is, 540\ nm}=10^{-5}$) and the pass band is reached above 640 nm ($\tau_{ip, 640\ nm}=0.99$).

Deviating from the above statements, the gaps for $\tau_{is}$ and $\tau_{ip}$ from $\lambda_c$ for filter glass having an edge wavelength in the near infrared can be greater than 40–60 nm.

Optical steep edge filters according to prior art comprise glass on cadmium sulfide, cadmium selenide and/or cadmium telluride bases, such as the glass specified in DE-OS 20 26 485 and DE-PS 26 21 741. The color effect allowing it to function as a filter with steep absorption edges in the spectral range between 455 and 850 nm is based on semiconductor particles, for example micro-crystalline (Zn, Cd)(S, Se, Te) with a particle size of 1–10 nm in a glass matrix.

The disadvantage of the earlier steep edge filters is that they contain toxic and carcinogenic Cd compounds, which requires complex safety and protective measures for batch preparation, reprocessing and disposal, for example.

Another disadvantage is that the edge wavelength can be varied only within the above mentioned spectral range in the visible range and the near infrared range. Steep edge filters in the longer-wave infrared range are desired especially for filters for infrared lights, substrates for infrared band-pass filters and filters for covering infrared LEDs.

A band-pass filter for a Raman spectrometer comprising a I-III-VI$_2$ single crystal is known from JP 03-277928.

The most important difference between a band-pass filter and a steep edge filter, as claimed in the present invention, is the fundamental principle of physics, and therefore the absorption and passing regions.

Band-pass filters can be produced by ion doping or interference coatings, for example, whose position and half-width depend on the ion type, the ion concentration or the type, the number and the thickness of the coatings. The electron transitions responsible for the absorption bands can be explained by the ligand field theory. Accordingly, electron transitions occur on individual wavelengths that correspond precisely to the energy required for transporting the electron from the energetically lowered orbitals to the energetically raised orbitals. The result is absorption at exactly said wavelength and thus a band is formed in the transmission spectrum.

In an edge filter, electron transitions take place between a conductance band and a valence band. The energy of the light must be greater than the band gap between the valence band and the conductance band so as to generate electron transitions. Light with energies of less than the band gap will not lead to electron transitions. Therefore, instead of selective electron transitions at certain wavelengths, electron transitions and thus absorption will occur up to a certain wavelength just corresponding to the energy of the band gap. Said certain wavelength represents the edge of the filter.

The aim of the invention is to provide cadmium-free optical steep edge filters with good cut-off in the short-wave range and high transmission in the long-wave range whose edge is variable over a wide wavelength range and which are environmentally compatible and easy to manufacture. In particular, the disadvantages encountered with optical steep edge filters according to prior art should be prevented.

SUMMARY OF THE INVENTION

The problem is solved by means of optical steep edge filters comprising I-III-VII compound semiconductor systems of stoichiometric or non-stoichiometric composition, where the I-III-VI compound semiconductors are systems with one or more of the following elements:

for the univalent (I) elements: Cu, Ag for the tervalent (III) elements: Al, In, Ga for the hexavalent (VI) elements: S, Se, Te.

According to the invention, the optical steep edge filters comprise I-III-VI compound semiconductors where the I-III-VI compound semiconductors are (Cu, Ag)(In, Ga, Al)-(S, Se, Te) systems.

The composition of the compounds can be stoichiometric or non-stoichiometric. The compounds have a more or less approximated chalkopyrite structure or chemical and structural variations deviating more or less from said structure.

I-III-VI semiconductor compounds of said system are known. The most well known are the boundary components CuInS$_2$ and CuInSe$_2$ of the CuIn (Se$_{1-x}$S$_x$)$_2$ system.

Such semiconductor compounds and alloys thereof are used, for example, as absorber layers in the field of polycrystalline thin-layer solar cells. In the field of photo voltaics, the highest possible optical absorption coefficient and a band gap of approx. 1 to 2 eV is of primary interest. In this context, reference is made, for example, to "Photo Voltaics, Energy from the Sun", Technology, Efficiency and Market Development, J. Schmidt (publisher), 3$^{rd}$ edition Heidelberg, Müller, 1994, whose disclosure content is hereby fully incorporated into the present application. Depending on the band gap of the semiconductor, the efficiency is limited by the unabsorbed photons or by the low output voltage. In order to achieve the highest possible energy yield semiconductors with a band gap in the medium range of the photo energy in the solar spectrum are used, i.e. in the range between 1 and 1.7 eV.

Glass coated with CuIn (Se$_{1-x}$S$_x$)$_2$ semiconductors is known to be used in photo voltaics according to G. Aren, O. P. Agnihotri, J. Materials Science Letters 12 (1993) 1176, for example.

SU 1527 199 A1 and SU 1677026 A1 show CuInS$_2$-doped bulk glass, for which the band gap of CuInS$_2$ chalkopyrite at 1.52 eV is used for filter glass. The disadvantage of said bulk glass, however, is that a continuous shift of the band edge is not possible. Also, it is difficult to manufacture such glass, because at the high temperatures required for melting the material a large portion of the semiconductor evaporates or decomposes oxidatively. Moreover, the heating process, i.e. the specific separation of smallest semiconductor crystals is difficult to master with a three-component system (CuInS$_2$), Surprisingly, the inventors found out that the application of class I-III-VI compound semiconductors to highly transparent substrates with a low refraction index and possibly an anti-reflection coating or an anti-reflection coating system and possibly a protective coating is highly suitable for producing Cd-free steep edge filters with edge wavelengths ranging between 460 and 1240 nm. The optical properties of said (Cu, Ag), (In, Ga, Al) (S, Se) coatings allow that conventional filters containing toxic elements, such as cadmium, can be replaced, and furthermore, the steep edge can be shifted to wavelength ranges especially >850 nm which cannot be achieved with conventional steep edge filters.

With thin coatings of class I-III-VI compound semiconductors on a transparent substrate, absorption edges in a wide spectral range between 460 and 1240 nm are obtained by means of variations in the composition, varying stoichiometry of the class I-III-VI compound semiconductors and by setting varying parameters during the vapor deposition process. and by setting varying parameters during the vapor deposition process. For a simultaneous application of the elements in high vacuum, physical deposition from the vapor phase, the so-called physical vapor deposition (PVD) is preferably used.

Plastic substrates or glass substrates can be used. Especially preferable are substrates with a very high transmission. For glass substrates soda-lime glass is especially preferred, most especially preferable is aluminum borosilicate glass.

The surface of the substrates should be as smooth as possible. Rough surfaces result in scattering which causes deterioration in the transmission.

In order to achieve an optimal UV block and in accordance with an especially preferred embodiment the glass substrate is a Ti-doped glass, for example soda-lime glass or aluminum borosilicate glass.

For better adhesion of the coating applied to the substrate, the substrate is treated by means of standard cleaning processes, for example using bi-distilled $H_2O$. Any $H_2O$ remaining on the substrate after it has been cleaned can be removed by means of a plasma treatment in vacuum.

According to a further development of the invention, transparent adhesion promoters, for example ZnO, can be used so as to improve adhesion.

BRIEF DESCRIPTION OF THE DRAWING

The invention will be explained below by means of the exemplary embodiments and the drawing, as follows.

DETAILED DESCRIPTION

Figure 1:
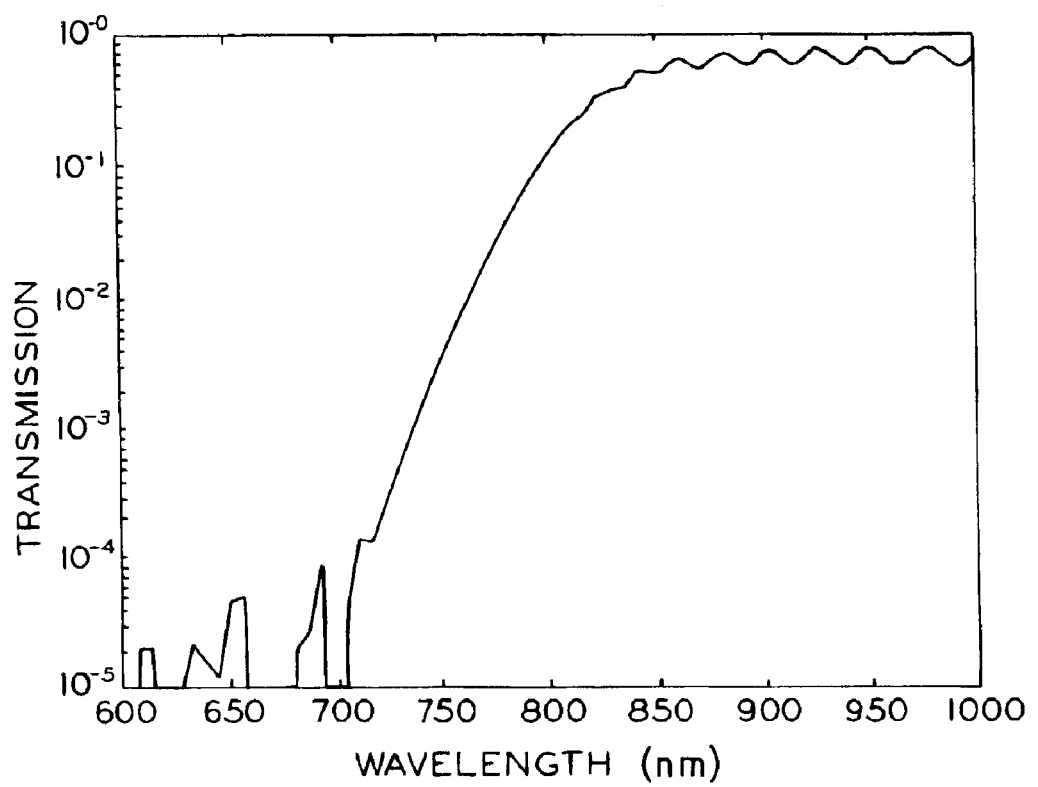
FIG. 1 shows the transmission curve of a (Cu, Ag) (In, Ga) (S, Se) coating on a transparent glass substrate with an anti-reflection coating.

As the first material system of the invention the Cu—In—S material system is described, also called CIS system, which was analyzed in two coating thicknesses (300 to 400 nm and approx. 1000 nm) and at two substrate temperatures (250 and 600° C.). Also, the composition of the system varied.

At a substrate temperature of 600° C., a vapor deposition time of 30 min. and with In/(In+Cu) ratios between 0.51 and 1.0, band gaps of 623 nm (1.99 eV) and 860 nm (1.44 eV) are achieved. With the same material system, at a substrate temperature of 600° C., a vapor deposition time of 15 min. and with In/(In+Cu) ratios between 0.55 and 0.83, band gaps of 746 nm (1.66 eV) and 854 nm (1.45 eV) are achieved.

The band gap was substantially increased at a lower substrate temperature of 250° C. With a vapor deposition time of 30 min. and an In/(In+Cu) ratio of 0.53, the band gap was 866 nm (1.43 eV).

Combined maximum and minimum values of the In/(In+Cu) ratio and the S/(In+Cu) ratio cannot always be equated with extreme band gap positions. This is also true for the following material systems and vapor deposition processes.

The optical coating properties with In/(In+Cu) of ≦0.5 are significantly affected by the manufacturing parameters and the composition. With the same coating thickness and an In/(In+Cu) ratio between 0.5 and 1, the steepness of the band edge clearly increases as the indium content decreases. The steepness of the band edge is a quality criterion for steep edge filters and therefore, it can be adjusted via the In content. An In/(In+Cu) ratio below 0.5, however, has an adverse effect on the pass band of the filter. With an In/(In+Cu) ratio less than 0.5, the coatings near stoichiometry and in the high-copper regions crystallize and cause a higher scattering of the coating. The scattering has a negative effect on the transmission, i.e. the transmission in the pass band drops below 80%. Moreover, the position of the band edge is adjusted via the indium content, i.e. when the indium content in the coatings increases, the band gap increases, and the band edge of the filter shifts toward shorter wavelengths. The composition range for the coatings having an In/(In+Cu) ratio between 0.5 and 1 is especially advantageous for use as a steep edge filter so as to adjust the position of the band edge, the stop band and the pass band accordingly.

The band edge shifts toward shorter wavelengths by the addition of gallium to the Cu—In—S system. The (In+Ga)/(In+Ga+Cu) ratio ranges between 0.51 and 0.66 and the Ga/(In+Ga) ratio ranges between 0 and 1. At a substrate temperature of 600° C. and a vapor deposition time of 30 min. band gaps between 685 nm (1.81 eV) and 805 nm (1.54 eV) can be achieved. Again, the band gap decreases at a lower temperature (550° C.) and with a shorter vapor deposition time (13 min.). The band gaps are then between 506 (2.44 eV) and 708 nm (1.75 eV).

Similar to the above described CIS system, the band edge flattens out with a constant Ga/(In+Ga) ratio and a decreasing Cu content, and when the Cu content increases, the transmission decreases. Coatings that are high in copper have a higher roughness which causes a transmission loss.

When gallium is added, two effects are noted, which are of special interest for the use as steep edge filters. For one, the band edge shifts toward shorter wavelengths as the Ga content increases without affecting the steepness of the edge, however. Also, with average Ga contents the scattering ratio decreases compared to pure $CuInS_2$ and $CuGaS_2$, resulting in a higher maximum transmission in the region of the absorption edge. Therefore, admixing gallium to the coating results in better filters with higher steepness and maximum transmission.

The effect of In on the (Cu, Ag)Ga—S systems is similar to the effect of Ga. The coatings become smoother by adding In (reduced scattering), i.e. the maximum transmission increases.

Band gaps between 770 (1.61 eV) and 925 nm (1.34 eV) are produced with the Cu—In—Ga—Se material system. The Cu—In—Ga—Se coatings were applied to the substrate at a substrate temperature between 300 and 500° C. and with vapor deposition times between 25 and 35 min. The (In+Ga)/(In+Ga+Cu) ratios range between 0.57 and 0.67 and the Ga/(In+Ga) ratios range between 0 and 1.

With the Cu—Ga—S—Se material system, at a substrate temperature of 550° C., a vapor deposition time of 25 min., Ga/(Ga+Cu) ratios between 0.51 and 0.73 and Se/(S+Se) ratios between 0 and 1, band gaps between 566 (2.13 eV) and 746 nm (1.66 eV) are achieved.

The Se content affects the maximum transmission, not the steepness of the transmission edge. Therefore, the coatings with a lower Se content have a reduced maximum transmission compared to coatings with a higher Se content, which is caused by the separation of metallic phases.

The band gap of the class I-III-VI compound semiconductors can be increased if copper is substituted by silver. Ag—In—Ga—S coatings were prepared at a substrate temperature of 550° C. and a vapor deposition time of 25 min. With the resulting (In+Ga)/(In+Ga+Ag) ratios between 0.44 and 0.66 and Ga/(In+Ga) ratios between 0 and 1, band gaps between 514 (2.33 eV) and 673 nm (1.84 eV) can be achieved.

In contrast to the Cu—In—Ga—S system, no dependence of the transmission on the stoichiometry was found with the Ag—In—Ga—S system. Differences are observed primarily in transmission and scattering. Ag—In—Ga—S compound semiconductor coatings that are high in silver have a higher transmission than the Cu—In—Ga—S compound semiconductor coatings that are high in copper. This is attributed to the separation of $Cu_2S$ which causes higher scattering.

In the Ag—In—Ga—S system, the effect of gallium is similar to that in the Cu—In—Ga—S system, which means the band edge can be shifted by the addition of gallium.

Yellow to light right coatings are predominantly obtained with Ag—In—Ga—S systems, which means a band gap between 460 and 670 nm. Dark red coatings are obtained by adding selenium. The resulting Ag—In—Ga—S—Se material system was again produced at a substrate temperature of 550° C. and a vapor deposition time of 30 min. with (In+Ga)/(In+Ga+Ag) ratios between 0.47 and 0.62, Ga/(In+Ga) ratios between 0.34 and 0.49 and Se/(S+Se) ratios between 0.11 and 0.46. (In+Ga)/(In+Ga+Ag) ratios between 0.47 and 0.62, Ga/(In+Ga) ratios between 0.34 and 0.49 and Se/(S+Se) ratios between 0.11 and 0.46. The band gap for said systems is between 755 (1.64 eV) and 789 nm (1.57 eV).

As mentioned above, in addition to the stoichiometry and the composition, the optical properties also depend on the thickness of the coating. The absorption coefficients were used for a comparison of the optical properties of coatings of varying thickness. For the CIS system, applied at a substrate temperature of 250° C., no significant difference in the absorption coefficient was detected at varying thicknesses (500 and 900 nm) in the high absorption region. In the low absorption region, in the case of thinner coatings the absorption is considerably higher below the band edge, which means with lower energy or larger wavelengths. This effect can be attributed to a lower crystallinity of the thinner coatings. This kind of behavior was also observed with coatings of varying thickness produced at 600° C.

Also, a comparison of the absorptions of the two thin coatings (produced at 600° and 250°) shows that the coating deposited at a higher temperature has a lower absorption below the band edge, which means with lower energy or larger wavelengths. The same is true for the thick coatings. Both the increase in the coating thickness and the increase in the substrate temperature contribute to an improvement in the optical properties of steep edge filters.

For the Cu—In—Ga—S coatings, the maximum transmission in the area of the absorption edge is lower in the case of thick coatings because of the scattering. Although thicker coatings have a steeper absorption edge, the transmission is limited by the scattering.

The effect of the coating thickness of the Ag—In—Ga—S coatings is more pronounced than in the analog copper system, because the coatings scatter highly even with a lesser thickness (600 nm). The trend is the same as in the copper systems, however, which means as the thickness increases, the transmission decreases and the absorption edge becomes steeper.

Therefore, the following interrelationships can be stated for the most important parameters of the coating properties:

A high substrate temperature causes larger crystallites which are related to higher scattering. At a low substrate temperature on the other hand, coatings high in defects are formed which results in higher absorption in the pass band. The Cu, Ag, Al/(In, Ga+Cu, Ag, Al) ratio affects the band gap and thus the edge position of the filter. The Cu/Ag, In/Ga, Ga/Al, S/Se ratio and respective combinations allow a continuous adjustment of the absorption edge. Deviations from the valence stoichiometry Se/Me increase the absorption in the pass band.

By applying an anti-reflection coating, such as $MgF_2$ or multi-coating systems, such as ($Al_2O_3$, $ZrO_2$, $MgF_2$) or ($TiO_2$, $SiO_2$), the optical properties of the steep edge filters can be further improved. Such a coating increases the maximum transmission in the pass band and the absorption edge becomes steeper. Moreover, the absorption edge shifts by approx. 2% toward smaller wavelengths. Additional improvements are possible in that instead of using simple single coating systems, appropriately adapted multi-coating systems are used for dereflection. Such coatings will not produce the absorption characteristics of the specified material; they only improve the transmission in the pass band.

Tables 1 to 5 contain exemplary embodiments of (Cu, Ag) (In, Ga) (S, Se) coatings on highly transparent substrates (for example D 263 of Schott-DESAG AG, Grünenplan), which meet the characteristics of steep edge filters between 460 and 1240 nm. FIG. 1 illustrates the curve of the transmission for a (Cu, Ag) (In, Ga) (Se) system with anti-reflection coating. As shown by the transmission curve, such a system is suitable for replacing Cd-containing red glass with an edge wavelength $\lambda_c$ of 850 nm.

TABLE 1

Exemplary embodiments of Cu—In—S compound conductors

| Substrate temperature [° C.] | Vapor deposition time [min.] | In/ (In + Cu) | S/ (In + Cu) | d (nm) | Band gap nm | Band gap eV |
| --- | --- | --- | --- | --- | --- | --- |
| 600 | 30 | 0.53 | 1.01 | 1066 | 860 | 1.44 |
| 600 | 15 | 0.79 | 1.33 | 354 | 854 | 1.45 |
| 600 | 15 | 0.83 | 1.41 | 351 | 746 | 1.66 |
| 600 | 30 | 1.0 | 1.42 | 1088 | 623 | 1.99 |
| 250 | 30 | 0.53 | 1.12 | 896 | 866 | 1.43 |
| 250 | 15 | 0.69 | 1.30 | 393 | 811 | 1.53 |
| 250 | 15 | 0.77 | 1.32 | 380 | 783 | 1.58 |

TABLE 2

Exemplary embodiments of Cu—(In, Ga)—S compound conductors

| Substrate temperature [° C.] | Vapor depositon time [min.] | (In + Ga)/ (In + Ga + Cu) | S/ (In + Ga + Cu) | Ga/ (In + Ga) | d (nm) | Band gap Nm | Band gap eV |
|---|---|---|---|---|---|---|---|
| 600/550 | 30/13 | 0.54 | 1.11 | 0.11 | 986 | 805 | 1.54 |
| 600/550 | 30/13 | 0.51 | 1.12 | 0.44 | 1269 | 765 | 1.62 |
| 600/550 | 30/13 | 0.58 | 1.26 | 0.40 | 1217 | 685 | 1.81 |
| 600/550 | 30/13 | 0.60 | 1.37 | 1 | 1031 | 506 | 2.44 |

TABLE 3

Exemplary embodiments of Cu—Ga—S—Se compound conductors

| Substrate temperature [° C.] | Vapor deposition time [min.] | Ga (Ga + Cu) | (S + Se)/ (Ga + Cu) | Se/ (S + Se) | d (nm) | Band gap Nm | Band gap eV |
|---|---|---|---|---|---|---|---|
| 550 | 25 | 0.51 | 1.41 | 0.30 | 579 | 746 | 1.66 |
| 550 | 25 | 0.73 | 1.72 | 0.30 | 406 | 566 | 2.13 |

TABLE 4

Exemplary embodiments of Cu—In—Ga—Se compound conductors

| Substrate temperature [° C.] | Vapor deposition time [min.] | (In + Ga)/ (In + Ga + Cu) | Se/ (In + Ga + Cu) | Ga/ (In + Ga) | d (nm) | Band gap Nm | Band gap eV |
|---|---|---|---|---|---|---|---|
| 300–500 | 25–35 | 0.57 | 1.06 | 0.46 | 1117 | 925 | 1.34 |
| 300–500 | 25–35 | 0.66 | 1.24 | 0.80 | 5637 | 770 | 1.61 |

TABLE 5

Exemplary embodiments of Ag—In—Ga—S—Se compound conductors

| Substrate temperature [° C.] | Vapor deposition time [min.] | (In + Ga)/ (In + Ga + Ag) | (S + Se)/ (In + Ga + Ag) | Ga/ (In + Ga) | Se/ (S + Se) | d (nm) | Band gap nm | Band gap eV |
|---|---|---|---|---|---|---|---|---|
| 550 | 30 | 0.62 | 1.26 | 0.35 | 0.48 | 703 | 789 | 1.57 |
| 550 | 30 | 0.47 | 1.06 | 0.34 | 0.11 | 838 | 755 | 1.64 |

The (Cu, Ag) (In, Ga) (S, Se) coatings are prepared by means of simultaneous vapor deposition of the elements to a heated substrate in high vacuum. The composition, the reaction and growth rates (coating thickness) are specifically varied via said so-called co-evaporation (also called physical vapor deposition=PVD). The elements copper, indium and gallium are evaporated from a graphite crucible and sulphur and selenium are evaporated from a high-grade steel source. A rotary screen covers the substrate during the heating phase and until the rates have stabilized.

The process is computer-controlled and allows regulation during the vapor deposition and a subsequent analysis. An anti-reflection coating is subsequently applied.

In addition to the thermal evaporation of the elements, copper, indium and gallium the substances can be applied to the substrate by means of sputtering via the gas phase.

Table 6 contains examples of class I-II-VI compound semiconductors with rising band gap.

TABLE 6

Examples of class I-III-VI compound semiconductor coatings on highly transparent substrates which can be used for Cd-free steep edge filters.

| Examples | In/(In + Cu) | S/(In + Cu) | d (nm) | Band gap nm | Band gap eV |
|---|---|---|---|---|---|
| Cu-In-S- compound semiconductors | 0.53 | 1.12 | 896 | 866 | 1.43 |
| | 9.53 | 1.01 | 1066 | 860 | 1.44 |
| | 0.55 | 1.06 | 1000 | 854 | 1.45 |
| | 0.79 | 1.33 | 354 | 854 | 1.45 |
| | 0.59 | 1.10 | 866 | 849 | 1.46 |
| | 0.56 | 1.06 | 972 | 843 | 1.47 |
| | 0.51 | 1.02 | 1048 | 832 | 1.49 |
| | 0.67 | 1.18 | 695 | 832 | 1.49 |
| | 0.55 | 1.11 | 463 | 829 | 1.49 |
| | 0.70 | 1.26 | 371 | 826 | 1.50 |
| | 0.64 | 1.19 | 392 | 821 | 1.51 |
| | 0.75 | 1.25 | 666 | 815 | 1.52 |
| | 0.69 | 1.30 | 393 | 811 | 1.53 |
| | 0.83 | 1.34 | 651 | 794 | 1.56 |
| | 0.76 | 1.30 | 330 | 789 | 1.57 |
| | 0.77 | 1.32 | 380 | 783 | 1.58 |
| | 0.83 | 1.41 | 351 | 746 | 1.66 |
| | 0.88 | 1.38 | 725 | 733 | 1.69 |
| | 1.00 | 1.42 | 1088 | 623 | 1.99 |

| Examples | (In + Ga)/(In + Ga + Cu) | S/(In + Ga + Cu) | Ga/(In + Ga) | d (nm) | Band gap nm | Band gap eV |
|---|---|---|---|---|---|---|
| Cu—In—Ga—S compound semiconductors | 0.54 | 1.11 | 0.11 | 986 | 805 | 1.54 |
| | 0.51 | 1.12 | 0.44 | 1269 | 765 | 1.62 |
| | 0.52 | 1.11 | 0.44 | 1232 | 760 | 1.63 |
| | 0.52 | 1.10 | 0.45 | 1185 | 747 | 1.66 |
| | 0.55 | 1.15 | 0.22 | 1200 | 738 | 1.68 |
| | 0.53 | 1.10 | 0.24 | 1289 | 738 | 1.68 |
| | 0.55 | 1.14 | 0.30 | 1318 | 725 | 1.71 |
| | 0.53 | 1.16 | 0.30 | 863 | 708 | 1.75 |
| | 0.51 | 1.12 | 0.46 | 1164 | 702 | 1.77 |
| | 0.58 | 1.26 | 0.40 | 1217 | 685 | 1.81 |
| | 0.54 | 1.17 | 0.38 | 867 | 681 | 1.82 |
| | 0.54 | 1.26 | 0.50 | 626 | 652 | 1.90 |
| | 0.54 | 1.22 | 0.56 | 804 | 632 | 1.96 |
| | 0.53 | 1.20 | 0.64 | 819 | 596 | 2.08 |
| | 0.60 | 1.80 | 0.44 | 702 | 593 | 2.09 |
| | 0.66 | 1.00 | 1.00 | 1332 | 539 | 2.30 |
| | 0.59 | 2.32 | 0.59 | 1397 | 539 | 2.30 |
| | 0.60 | 1.37 | 1.00 | 1031 | 506 | 2.44 |
| | 0.66 | 1.86 | 0.70 | 1751 | 506 | 2.45 |

| Examples | Ga/(Ga + Cu) | (S + Se)/(Ga + Cu) | Se/(S + Se) | d (nm) | Band gap nm | Band gap eV |
|---|---|---|---|---|---|---|
| Cu—Ga—S—Se compound semiconductors | 0.51 | 1.41 | 0.30 | 579 | 746 | 1.66 |
| | 0.58 | 1.34 | 0.58 | 636 | 737 | 1.68 |
| | 0.54 | 1.42 | 0.40 | 595 | 733 | 1.69 |
| | 0.56 | 1.50 | 0.30 | 456 | 590 | 2.10 |
| | 0.73 | 1.72 | 0.30 | 406 | 566 | 2.13 |

| Examples | (In + Ga)/(In + Ga + Ag) | S/(In + Ga + Ag) | Ga/(In + Ga) | d (nm) | Band gap nm | Band gap eV |
|---|---|---|---|---|---|---|
| Ag—In—Ga—S compound semiconductors | 0.46 | 1.11 | 0.57 | 473 | 673 | 1.84 |
| | 0.51 | 1.13 | 0.37 | 562 | 639 | 1.94 |
| | 0.46 | 1.15 | 0.37 | 535 | 632 | 1.96 |
| | 0.45 | 1.11 | 0.57 | 314 | 582 | 2.13 |
| | 0.66 | 1.22 | 0.54 | 473 | 576 | 2.15 |
| | 0.44 | 1.48 | 0.51 | 348 | 553 | 2.24 |
| | 0.45 | 1.56 | 0.62 | 257 | 543 | 2.28 |
| | 0.62 | 1.56 | 0.68 | 323 | 514 | 2.33 |
| | 0.49 | 1.45 | 0.69 | 255 | 514 | 2.33 |

| Examples | (In + Ga)/(In + Ga + Ag) | (S + Se)/(In + Ga + Ag) | Ga/(In + Ga) | Se/(S + Se) | d (nm) | Band gap nm | Band gap eV |
|---|---|---|---|---|---|---|---|

TABLE 6-continued

Examples of class I-III-VI compound semiconductor coatings on highly transparent substrates which can be used for Cd-free steep edge filters.

| | | | | | | | |
|---|---|---|---|---|---|---|---|
| Ag—In—Ga— | 0.52 | 1.14 | 0.49 | 0.53 | 658 | 789 | 1.57 |
| S—Se | 0.62 | 1.26 | 0.35 | 0.48 | 703 | 789 | 1.57 |
| system | 0.47 | 1.06 | 0.34 | 0.11 | 838 | 755 | 1.64 |

| Examples | (In + Ga)/(In + Ga + Cu) | Se/(In + Ga + Cu) | Ga/(In + Ga) | d (nm) | Band gap nm | Band gap eV |
|---|---|---|---|---|---|---|
| Cu In Ga Se system | 0.57 | 1.06 | 0.46 | 1117 | 925 | 1.34 |
| | 0.57 | 1.11 | 0.81 | 6885 | 891 | 1.39 |
| | 0.59 | 1.08 | 0.57 | 2955 | 879 | 1.41 |
| | 0.65 | 1.15 | 0.70 | 4801 | 832 | 1.49 |
| | 0.62 | 1.13 | 0.69 | 3984 | 821 | 1.51 |
| | 0.61 | 1.11 | 0.62 | 2256 | 794 | 1.56 |
| | 0.60 | 1.09 | 0.83 | 6434 | 789 | 1.57 |
| | 0.57 | 1.00 | 0.56 | 2396 | 789 | 1.57 |
| | 0.67 | 1.18 | 0.76 | 4936 | 779 | 1.59 |
| | 0.66 | 1.24 | 0.80 | 5637 | 770 | 1.61 |

The present invention provides Cd-free optical steep edge filters on the basis of thin coatings of class I-III-VI compound semiconductors on highly transparent glass substrates or highly transparent and highly temperature-resistant plastic substrates. The thin coatings of class I-III-VI compound semiconductors are polycrystalline coatings of nano-crystals of uniform composition. If nano-crystals of varying compositions are present in a coating the electron transitions will vary so that a steep edge with a defined edge position cannot be formed. The size of the nano-crystals is preferably much smaller than the wavelength of the light so as to largely prevent light scattering. The crystallite size is preferably less than 50 nm, especially preferably less than 20 nm, especially less than 15 nm, most especially preferably less than 10 nm. While the crystallites have a uniform composition for forming a defined edge position, their crystallite size can have a crystallite size distribution having no effect on the position of the steep edge. For example, the crystallite size of the nano-crystals of a particular coating can range between 1 and 10 nm. If the crystallite size distribution is within said range between 1 and 10 nm, for example, the scattering of visible light is prevented. The substrates coated with the class I-III-VI compound semiconductors represent an ecological alternative for the above conventional cadmium-containing glass. They are also characterized by a good cut-off in the short-wave range, by high transmission in the long-wave range, and above all, by a wide steep edge wavelength range between 460 and 1240 nm. Compared to conventional steep edge filters maximum edge positions of more than 850 nm can be achieved in the long-wave range. The maximum long-wave absorption edge for conventional steep edge filters is approx. 850 nm.

What is claimed is:

1. A cadmium free optical steep edge filter comprising
   a I-III-VI compound semiconductor system of stoichiometric or non-stoichiometric composition, where the I-III-VI compound semiconductor is a system with one or more of the following elements:
   for the univalent (I) elements: Cu, Ag
   for the tervalent (III) elements: Al, In, Ga
   for the hexavalent (VI) elements: S, Se, Te,
   the optical steep edge filter having at least one transparent substrate and at least one coating deposited on said substrate comprising a I-III-VI compound semiconductor system of stoichiometric or non-stoichiometric composition.

2. The cadmium-free optical steep edge filter as defined in claim 1, characterized in that the cadmium-free optical steep edge filter has an edge wavelength between 460 nm and 1240 nm.

3. The cadmium-free optical steep edge filter as defined in claim 1, characterized in that the transparent substrate is a glass substrate.

4. The cadmium-free optical steep edge filter as defined in claim 1, characterized in that the transparent substrate is a plastic substrate.

5. The cadmium-free optical steep edge filter as defined in claim 3, characterized in that the glass substrate comprises a Ti-doped lime sodium glass.

6. The cadmium-free optical steep edge filter as defined in claim 1, characterized in that the system of at least one substrate and at least one coating comprising a I-III-VI compound semiconductor further comprises an anti-reflection coating or an anti-reflection coating system.

7. The cadmium-free optical steep edge filter as defined in claim 1, characterized in that the steep edge filter comprises an adhesion promoting layer between the at least one transparent substrate and the at least one I-III-VI compound semiconductor coating.

8. The cadmium-free optical steep edge filter as defined in claim 1, characterized in that on both sides of the transparent substrate at least one compound semiconductor coating and/or functional filter coating is applied.

9. The cadmium-free optical steep edge filter as defined in claim 1, characterized in that on one side of the transparent substrate at least one compound semiconductor coating and/or functional filter coating is applied and on the other side is an infrared cut coating for band filters in the infrared range.

10. The cadmium-free optical steep edge filter as defined in claim 8, characterized in that the compound semiconductor coatings on the two substrate sides have varying thickness and/or stoichiometry.

11. The cadmium-free optical steep edge filter as defined in claim 1, characterized in that the compound semiconductor coating and/or anti-reflection coating is a coating applied by means of a sputtering process.

12. The cadmium-free optical steep edge filter as defined in claim 1, characterized in that the steep edge filter has an edge wavelength of >850 nm.

13. The cadmium-free optical steep edge filter as defined in claim 1, characterized in that the cadmium-free optical steep edge filter has an edge wavelength of <460 nm and a semiconductor compound of the Cu—Al—Se or Cu—Al—S or Cu—Al—S/Se system.

14. The cadmium-free optical steep edge filter as defined in claim 1, characterized in that the compound semiconductor is a ternary Cu—In—Se system, where In/(In+Cu) is between 0.5 and 1.0 and the filter has an edge wavelength between 983 and 623 nm.

15. The cadmium-free optical steep edge filter as defined in claim 1, characterized in that the compound semiconductor is a ternary Cu—In—Se system, where In/(In+Cu) is between 0.5 and 1.0 and the filter has an edge wavelength between 1192 and 919 nm.

16. The cadmium-free optical steep edge filter as defined in claim 1, characterized in that the compound semiconductor is a ternary Cu—Ga—S system, where Ga/(Ga+Cu) is between 0.5 and 1.0 and the filter has an edge wavelength between 504 and 460 nm.

17. The cadmium-free optical steep edge filter as defined in claim 1, characterized in that the compound semiconductor is a ternary Cu—Ga—Se system, where Ga/(Ga+Cu) is between 0.5 and 1.0 and the filter has an edge wavelength between 738 and 646 nm.

18. The cadmium-free optical steep edge filter as defined in claim 1, characterized in that the compound semiconductor is a ternary Ag—In—S system, where In/(In+Ag) is between 0.5 and 1.0 and the filter has an edge wavelength between 653 and 564 nm.

19. The cadmium-free optical steep edge filter as defined in claim 1, characterized in that the compound semiconductor is a ternary Ag—In—Se system, where In/(In+Ag) is between 0.5 and 1.0 and the filter has an edge wavelength between 992 and 919 nm.

20. The cadmium-free optical steep edge filter as defined in claim 1, characterized in that the compound semiconductor is a ternary Ag—Ga—S system, where Ga/(Ga+Ag) is between 0.5 and 1.0 and the filter has an edge wavelength between 466 and 460 nm.

21. The cadmium-free optical steep edge filter as defined in claim 1, characterized in that the compound semiconductor is a ternary Ag—Ga—Se system, where Ga/(Ga+Ag) is between 0.5 and 1.0 and the filter has an edge wavelength between 689 and 646 nm.

22. A method for manufacturing cadmium-free optical steep edge filters comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te and comprising a substrate and a coating applied to said substrate with a compound semiconductor comprising the following steps:

the substrate is heated up to a substrate temperature ranging between 200° C. and 800° C.; and the I-III-VI compound semiconductor is applied to the heated substrate by means of physical vapor deposition (PVD) or a sputtering process.

23. The method as defined in claim 22, characterized in that an anti-reflecting coating of $MgF_2$ or a multi-coating system of ($MgF_2$, $Al_2O_3$, $ZrO_2$), ($TiO_2$, $SiO_2$) is applied to the I-III-VI compound semiconductor coating.

24. The method as defined in claim 22, characterized in that a protective coating or a protective coating system of $SiO_2$ varnishes or plastic is applied to the I-III-VI compound semiconductor coating or to the I-III-VI compound semiconductor coating and an anti-reflecting coating or an anti-reflecting coating system.

25. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the cadmium-free optical steep edge filter has an edge wavelength of <460 nm and a semiconductor compound of the Cu—Al—Se or Cu—Al—S or Cu—Al—S/Se system.

26. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Cu—In—Se system, where In/(In+Cu) is between 0.5 and 1.0 and the filter has an edge wavelength between 983 and 623 nm.

27. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Cu—In—Se system, where In/(In+Cu) is between 0.5 and 1.0 and the filter has an edge wavelength between 1192 and 919 nm.

28. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Cu—Ga—S system, where Ga/(Ga+Cu) is between 0.5 and 1.0 and the filter has an edge wavelength between 504 and 460 nm.

29. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Cu—Ga—Se system, where Ga/(Ga+Cu) is between 0.5 and 1.0 and the filter has an edge wavelength between 738 and 646 nm.

30. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Ag—In—S system, where In/(In+Ag) is between 0.5 and 1.0 and the filter has an edge wavelength between 653 and 564 nm.

31. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Ag—In—Se system, where In/(In+Ag) is between 0.5 and 1.0 and the filter has an edge wavelength between 992 and 919 nm.

32. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Ag—Ga—S system, where Ga/(Ga+Ag) is between 0.5 and 1.0 and the filter has an edge wavelength between 466 and 460 nm.

33. A cadmium-free optical steep edge filter comprising a I-III-VI compound semiconductor system of stoichiometric or non-stoichiometric composition, where the I-III-VI compound semiconductor is a system with one or more of the following elements:

for the univalent (I) elements: Cu, Ag for the tervalent (III) elements: Al, In, Ga for the hexavalent (VI) elements: S, Se, Te, wherein the compound semiconductor is a ternary Ag—Ga—Se system, where Ga/(Ga+Ag) is between 0.5 and 1.0 and the filter has an edge wavelength between 689 and 646 nm.

34. The method as defined in claim 22, wherein the substrate is heated up to a substrate temperature ranging between 250° C. and 600° C.

* * * * *